(12) United States Patent
Bao et al.

(10) Patent No.: US 9,337,082 B2
(45) Date of Patent: May 10, 2016

(54) METAL LINES HAVING ETCH-BIAS INDEPENDENT HEIGHT

(71) Applicant: GLOBALFOUNDRIES INC., Grand Cayman, KY (US)

(72) Inventors: Junjing Bao, Cedar Grove, NJ (US); Wai-Kin Li, Beacon, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 13/744,756

(22) Filed: Jan. 18, 2013

(65) Prior Publication Data

US 2014/0203447 A1 Jul. 24, 2014

(51) Int. Cl.
*H01L 23/48* (2006.01)
*H01L 21/336* (2006.01)
*H01L 21/768* (2006.01)

(52) U.S. Cl.
CPC ...... *H01L 21/7681* (2013.01); *H01L 21/76811* (2013.01); *H01L 21/76813* (2013.01); *H01L 21/76816* (2013.01)

(58) Field of Classification Search
USPC ......... 438/303, 591, 618, 421, 584, 637, 783, 438/763
See application file for complete search history.

(56) References Cited

U.S. PATENT DOCUMENTS

| | | |
|---|---|---|
| 5,284,549 A | 2/1994 | Barnes et al. |
| 5,637,189 A | 6/1997 | Peeters et al. |
| 6,511,904 B1 | 1/2003 | Chen et al. |
| 6,764,941 B2 | 7/2004 | Yang et al. |
| 6,828,250 B1 | 12/2004 | Annapragada et al. |
| 6,900,136 B2 | 5/2005 | Chung et al. |
| 7,635,650 B2 | 12/2009 | Miyata |
| 8,138,093 B2 | 3/2012 | Akinmade-Yusuff et al. |
| 8,227,339 B2 | 7/2012 | Ponoth et al. |
| 2002/0158337 A1* | 10/2002 | Babich et al. ................. 257/758 |
| 2005/0184397 A1* | 8/2005 | Gates et al. .................... 257/774 |
| 2008/0254614 A1* | 10/2008 | Hedrick et al. ............... 438/627 |
| 2009/0303366 A1* | 12/2009 | Gambino .......... H01L 27/14632 348/308 |
| 2010/0041202 A1* | 2/2010 | Abadeer et al. ............... 438/384 |
| 2010/0237467 A1* | 9/2010 | Dalton .............. H01L 21/76816 257/536 |
| 2011/0073997 A1* | 3/2011 | Leuschner .......... H01L 21/7681 257/621 |
| 2011/0244687 A1 | 10/2011 | Oohara et al. |
| 2012/0168957 A1 | 7/2012 | Srivastava et al. |

OTHER PUBLICATIONS

Jansen, H. et al., "RIE Lag in High Aspect Ratio Trench Etching of Silicon" Microelectronic Engineering (Feb. 1997) pp. 45-50, vol. 35, Nos. 1-4.

* cited by examiner

*Primary Examiner* — Selim Ahmed
*Assistant Examiner* — Moin Rahman
(74) *Attorney, Agent, or Firm* — Scully, Scott, Murphy & Presser, P.C.

(57) ABSTRACT

A dielectric material stack including at least a via level dielectric material layer, at least one patterned etch stop dielectric material portion, a line level dielectric material layer, and optionally a dielectric cap layer is formed over a substrate. At least one patterned hard mask layer including a first pattern can be formed above the dielectric material stack. A second pattern is transferred through the line level dielectric material layer employing the at least one etch stop dielectric material portion as an etch stop structure. The first pattern is transferred through the line level dielectric material layer employing the at least one etch stop dielectric material portion as an etch stop structure while the second pattern is transferred through the via level dielectric material layer to form integrated line and via trenches, which are filled with a conductive material to form integrated line and via structures.

9 Claims, 17 Drawing Sheets

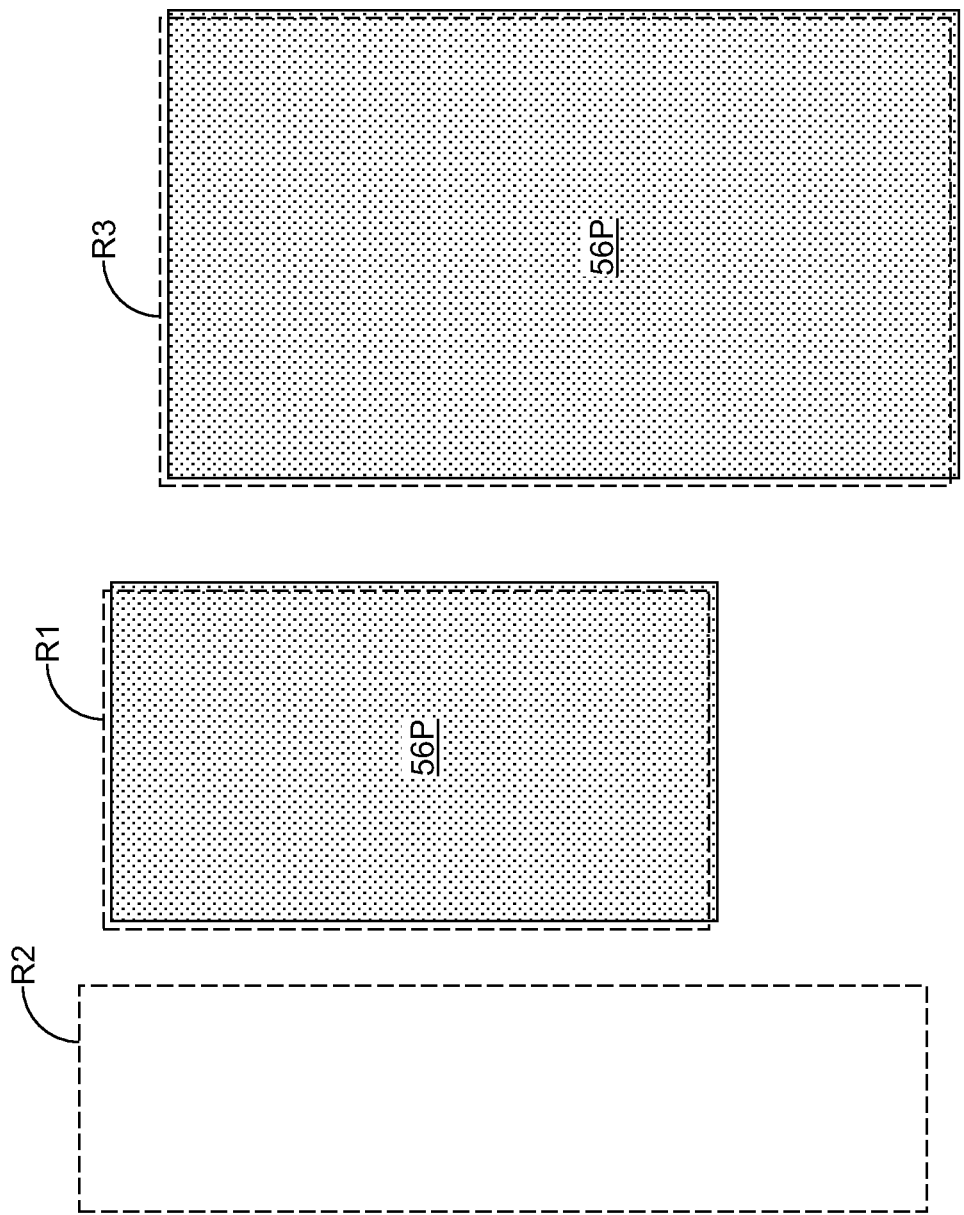

METAL LINES HAVING ETCH-BIAS INDEPENDENT HEIGHT

BACKGROUND

The present disclosure relates to metal interconnect structures, and particularly to metal interconnect structures having etch-bias independent height and methods for manufacturing the same.

Reactive ion etch (RIE) can be used to produce trenches having depths that are dependent on the width of a trench. Simultaneous etching of multiple trenches having different widths result in formation of narrower trenches having a lesser depth and wider trenches having a greater depth. The variations in the depths of the trenches depending on the width of the trenches are referred to as a RIE lag.

The RIE lag causes non-uniformity in the depths of the trenches. The resulting metal lines obtained by filling the trenches with a conductive material have different depths that depend on the width of the metal lines. Narrower metal lines have a lesser height and wider metal lines have a greater height. As the minimum width of the metal lines shrinks with scaling of semiconductor devices, the effect of the RIE lag becomes severer. The variation in the height of metal lines as a function of width is a significant obstacle for device scaling.

BRIEF SUMMARY

A dielectric material stack including at least a via level dielectric material layer, at least one patterned etch stop dielectric material portion, a line level dielectric material layer, and optionally a dielectric cap layer is formed over a substrate. The at least one etch stop dielectric material portion can be formed in areas in which metal lines having widths greater than a minimum line width are to be formed. At least one patterned hard mask layer including a first pattern, which can be a line pattern, can be formed above the dielectric material stack. A second pattern, which can be a via pattern, is transferred through the line level dielectric material layer employing the at least one etch stop dielectric material portion as an etch stop structure. After removal of physically exposed regions of the at least one etch stop dielectric material portion, the first pattern is transferred through the line level dielectric material layer employing the at least one etch stop dielectric material portion as an etch stop structure while the second pattern is transferred through the via level dielectric material layer to form integrated line and via trenches, which are filled with a conductive material to form integrated line and via structures.

According to an aspect of the present disclosure, a structure including a dielectric material stack and an integrated line and via structure is provided. The dielectric material stack includes at least a via level dielectric material layer, at least one etch stop dielectric material portion, and a line level dielectric material layer located over a substrate. The integrated line and via structure is embedded within the dielectric material stack and includes at least one metallic via structure and a metallic line structure. The at least one metallic via structure is embedded within the via level dielectric material layer, the metallic line structure is embedded within the line level dielectric material layer, and one of the at least one etch stop dielectric material portion laterally surrounds the metallic line structure.

According to another aspect of the present disclosure, a method of forming at least one metal interconnect structure in a dielectric material stack is provided. A dielectric material stack is formed over a substrate. The dielectric material stack includes at least, from bottom to top, a via level dielectric material layer, at least one patterned etch stop dielectric material portion, and a line level dielectric material layer. The at least one patterned etch stop dielectric material portion is present in a first region and not present in a second region. A first cavity and a second cavity are simultaneously etched through the line level dielectric material layer. The first cavity is formed in the first region, and etching of the first cavity stops on the at least one etch stop dielectric material portion. The second cavity is formed in the second region.

BRIEF DESCRIPTION OF THE SEVERAL VIEWS OF THE DRAWINGS

FIG. 2A is a horizontal cross-sectional view of the exemplary structure of FIG. 2 along the plane A-A'.

DETAILED DESCRIPTION

Figure 1:
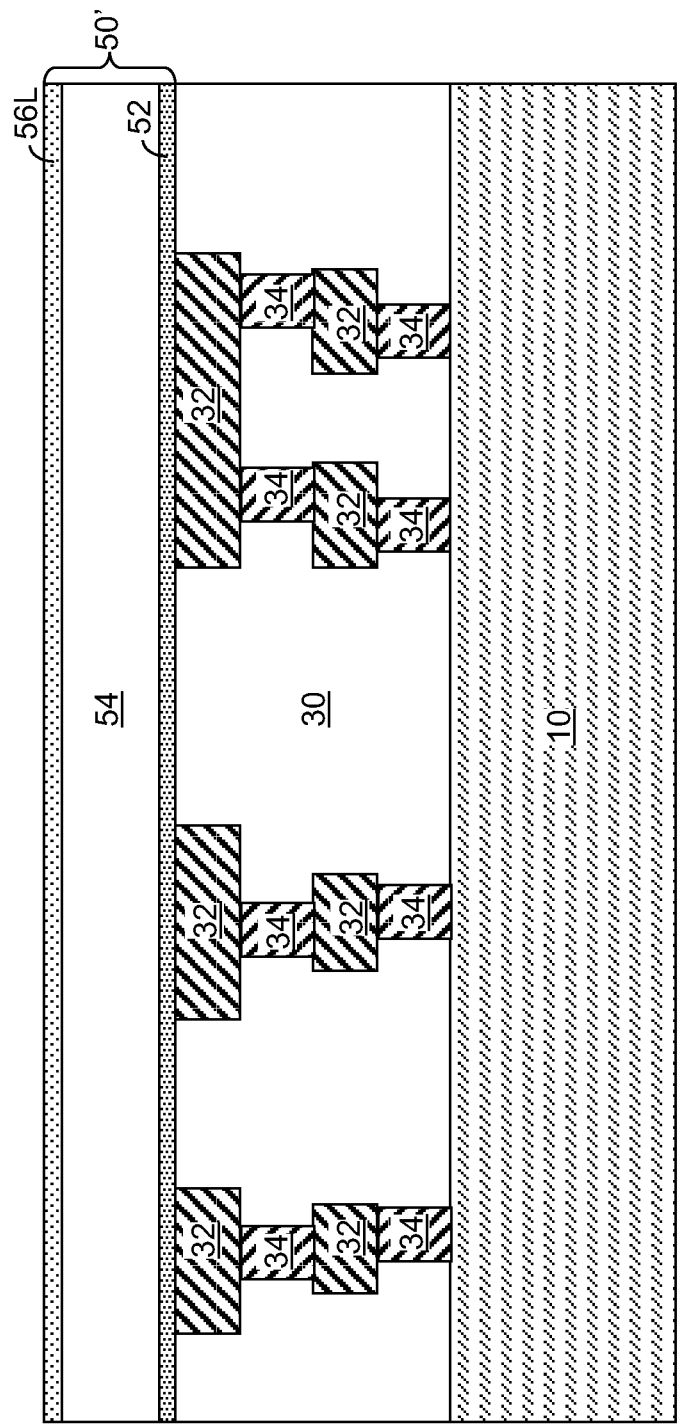
FIG. 1 is a vertical cross-sectional view of an exemplary structure after formation of a dielectric liner, a via level dielectric material layer, and an etch stop dielectric material layer according to an embodiment of the present disclosure.

As stated above, the present disclosure relates to metal interconnect structures having etch-bias independent height and methods for manufacturing the same. Aspects of the present disclosure are now described in detail with accompanying figures. Throughout the drawings, the same reference numerals or letters are used to designate like or equivalent elements. The drawings are not necessarily drawn to scale.

Referring to FIG. 1, an exemplary structure according to an embodiment of the present disclosure includes a substrate 10 and an optional metal interconnect structure (30, 32, 34) formed thereupon. The substrate 10 can include a semiconductor material, an insulator material, a conductive material, or combinations thereof. In one embodiment, the substrate 10 can be a semiconductor substrate. At least one semiconductor device (not shown) such as a field effect transistor, a junction transistor, a diode, a capacitor, an inductor, or any other semiconductor device can be formed on the semiconductor substrate.

The optional metal interconnect structure (30, 32, 34) includes at least one optional dielectric material layer 30, optional underlying metal lines 32, and optional underlying via structures 32. The optional underlying metal semiconductor structure (30, 32, 34) may be formed employing any method known in the art for forming metal interconnect structures. The various optional underlying metal lines 32 and via structures 34 can provide electrical connections among semiconductor devices on the substrate 10 and/or electrical connections between the semiconductor devices and uppermost metal lines 32 among the optional underlying metal lines 32. Alternately, methods of the present disclosure to be described below may be employed to form a portion or all of the optional metal interconnect structure (30, 32, 34). In one embodiment, the topmost surface of the at least one optional dielectric material layer 30 and the topmost surfaces of the uppermost metal lines 32 embedded within the at least one optional dielectric material layer 30 may be coplanar among one another. In this case, the entirety of the top surface of the optional metal interconnect structure (30, 32, 34) can be a horizontal surface.

A partial dielectric material stack 50' is formed over the optional metal interconnect structure (30, 32, 34). In one embodiment, the optional metal interconnect structure (30, 32, 34) is present, and the partial dielectric material stack 50' is formed directly on the top surface of the metal interconnect structure (30, 32, 34). In another embodiment, the optional metal interconnect structure (30, 32, 34) is not present, and the partial dielectric material stack 50' can be formed on the substrate 10 or on semiconductor devices (not shown) located on the top surface of the substrate 10.

The partial dielectric material stack 50' is a stack of dielectric material layers, and is a subset of a dielectric material stack to be completed in subsequent processing steps. The partial dielectric material stack 50' can include, from bottom to top, an optional dielectric liner 52, a via level dielectric material layer 54, and an etch stop dielectric material layer 56L.

The optional dielectric liner 52 includes a dielectric material that is different from the dielectric material of the via level dielectric material layer 54. The dielectric material of the optional dielectric liner 52 can be selected to provide a greater etch resistance to an etch chemistry to be subsequently employed to etch the material of the via level dielectric material layer 54. In one embodiment, the optional dielectric liner 52 can include silicon nitride, silicon oxide, silicon oxynitride, a nitrogen-doped organosilicate glass such as BLok™ by Applied Materials, Inc., a dielectric metal oxide material such as hafnium oxide, zirconium oxide, lanthanum oxide, tantalum oxide, or combinations thereof. The optional dielectric liner 52 can be formed, for example, by chemical vapor deposition (CVD). The thickness of the optional dielectric liner 52, if present, can be from 1 nm to 10 nm, although lesser and greater thicknesses can also be employed.

The via level dielectric material layer 54 includes a dielectric material, which can be a porous or non-porous organosilicate glass having a dielectric constant less than 2.8. Alternately or additionally, the via level dielectric material layer 54 can include doped silicon oxide and/or undoped silicon oxide. The via level dielectric material layer 54 can be formed, for example, by chemical vapor deposition. The thickness of the via level dielectric material layer 54 depends on the target height of via structures to be subsequently formed, and can be in a range from 10 nm to 300 nm, although lesser and greater thicknesses can also be employed.

The etch stop dielectric material layer 56L includes a dielectric material having a greater etch resistance than a dielectric material of a line level dielectric material layer to be subsequently deposited thereupon. For example, the etch stop dielectric material layer 56L can include silicon nitride, silicon oxynitride, silicon oxide, a nitrogen-doped organosilicate glass such as BLok™ by Applied Materials, Inc., or a dielectric metal oxide material. In one embodiment, the via level dielectric material layer 54 can include a porous or non-porous organosilicate glass, and the etch stop dielectric material layer 56L can include silicon nitride or silicon oxide. In one embodiment, the etch stop dielectric material layer 56L can have the same composition as the optional dielectric liner 52. The etch stop dielectric material layer 56L can be formed, for example, by chemical vapor deposition (CVD). The thickness of the etch stop dielectric material layer 56L can be from 1 nm to 10 nm, although lesser and greater thicknesses can also be employed.

Each of the optional dielectric liner 52, the via level dielectric material layer 54, and the etch stop dielectric material layer 56L can be formed as a blanket dielectric material layer, i.e., as an unpatterned dielectric material layer, having a uniform thickness throughout. No conductive structure is present within the partial dielectric material stack 50' upon formation of the partial dielectric material stack 50'.

Figure 2:
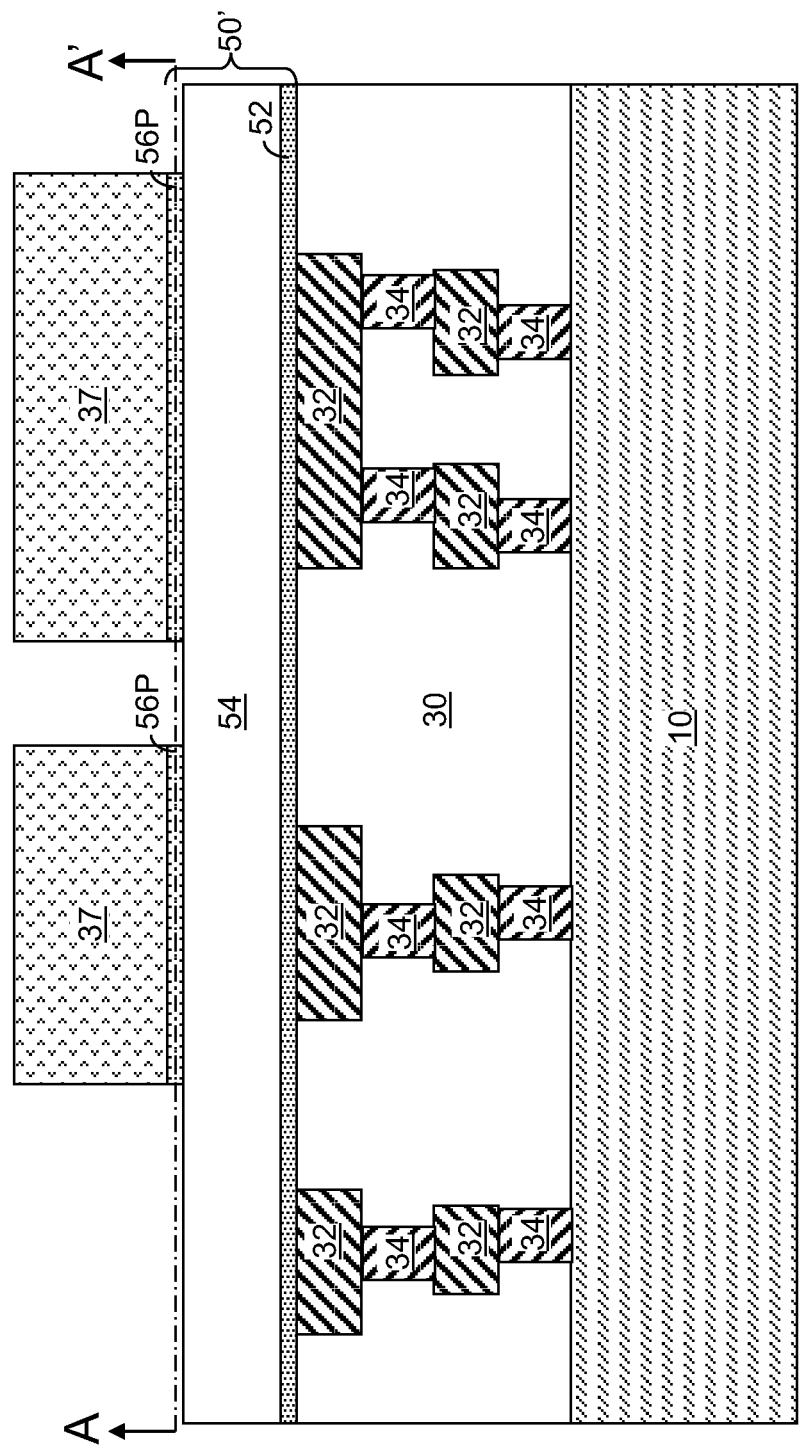
FIG. 2 is a vertical cross-sectional view of the exemplary structure after formation of patterned etch stop dielectric material portions by lithographic patterning of a photoresist and a pattern transfer etch according to an embodiment of the present disclosure.

Referring to FIGS. 2 and 2A, a photoresist layer 37 is applied over the etch stop dielectric material layer 56L, and is lithographically patterned to cover selected regions. In one embodiment, the regions to be covered by the patterned photoresist layer 37 can be selected such that the selected regions will subsequently include metal lines having a greater width than a minimum metal line width.

As used herein, a "minimum metal line width" refers to the smallest width of all metal lines to be subsequently formed directly above the via level dielectric material layer 54. In one embodiment, the metal lines having a greater width than the minimum metal line width can have widths that are at least twice the minimum metal line width. In another embodiment, the metal lines having a greater width than the minimum metal line width can have widths that are at least three times the minimum metal line width. In one embodiment, the minimum metal line width can be the minimum dimension that a lithographic tool to be subsequently employed to generate the lithographic pattern defining the metal lines can print, i.e., the "critical dimension" of the lithographic tool. The minimum metal line width can be from 32 nm to 200 nm, although lesser and greater minimum metal line widths can also be employed.

Physically exposed portions of the etch stop dielectric material layer 56L are etched employing the photoresist layer 37 as an etch mask. A wet etch or a dry etch that is selective to, i.e., does not substantially etch, the dielectric material of the via level dielectric material layer 54 can be employed to remove the physically exposed portions of the etch stop dielectric material layer 56L. The remaining portions of the etch stop dielectric material layer 56L are herein referred to as etch stop dielectric material portions 56P. The pattern of the photoresist layer 37 is herein referred to as an etch stop region-defining pattern. The shapes of the etch stop dielectric material portions 56P are substantially identical to the shapes of the etch stop region-defining pattern. Any difference between the shapes of the etch stop dielectric material portions 56P and the shapes of the etch stop region-defining pattern correspond to a lateral offset of the etch process employed to etch physically exposed portions of the etch stop dielectric material layer 56L. The lateral offset is typically less than the thickness of the etch stop dielectric material layer 56L, and can be less than 3 nm. In one embodiment, the etch that transfers the etch stop region-defining pattern into the etch stop dielectric material layer 56L can be an anisotropic etch. In this case, the shapes of the etch stop dielectric material portions 56P can be identical to the etch stop region-defining pattern of the patterned photoresist layer 37.

In one embodiment, the area of the exemplary structure can include a first region R1 that coincide with the area of one of the etch stop dielectric material portions 56P, a second region R2 that is a portion of the area from which the etch stop dielectric material layer 56L is removed (and therefore, an etch stop dielectric material portion does not exist in the second region R2), and a third region that coincides with the area of another of the etch stop dielectric material portions 56P.

In one embodiment, the size of each etch stop dielectric material portion 56P can be determined such that the periphery of the etch stop dielectric material portion 56P is laterally offset outward from the periphery of a metal line to be subsequently formed by a distance greater than the maximum overlay tolerance of lithographic processes to be employed to pattern the shapes for the metal lines. The photoresist layer 37 is subsequently removed selective to the etch stop dielectric material portions 56P and the via level dielectric material layer 54, for example, by ashing.

Figure 3:
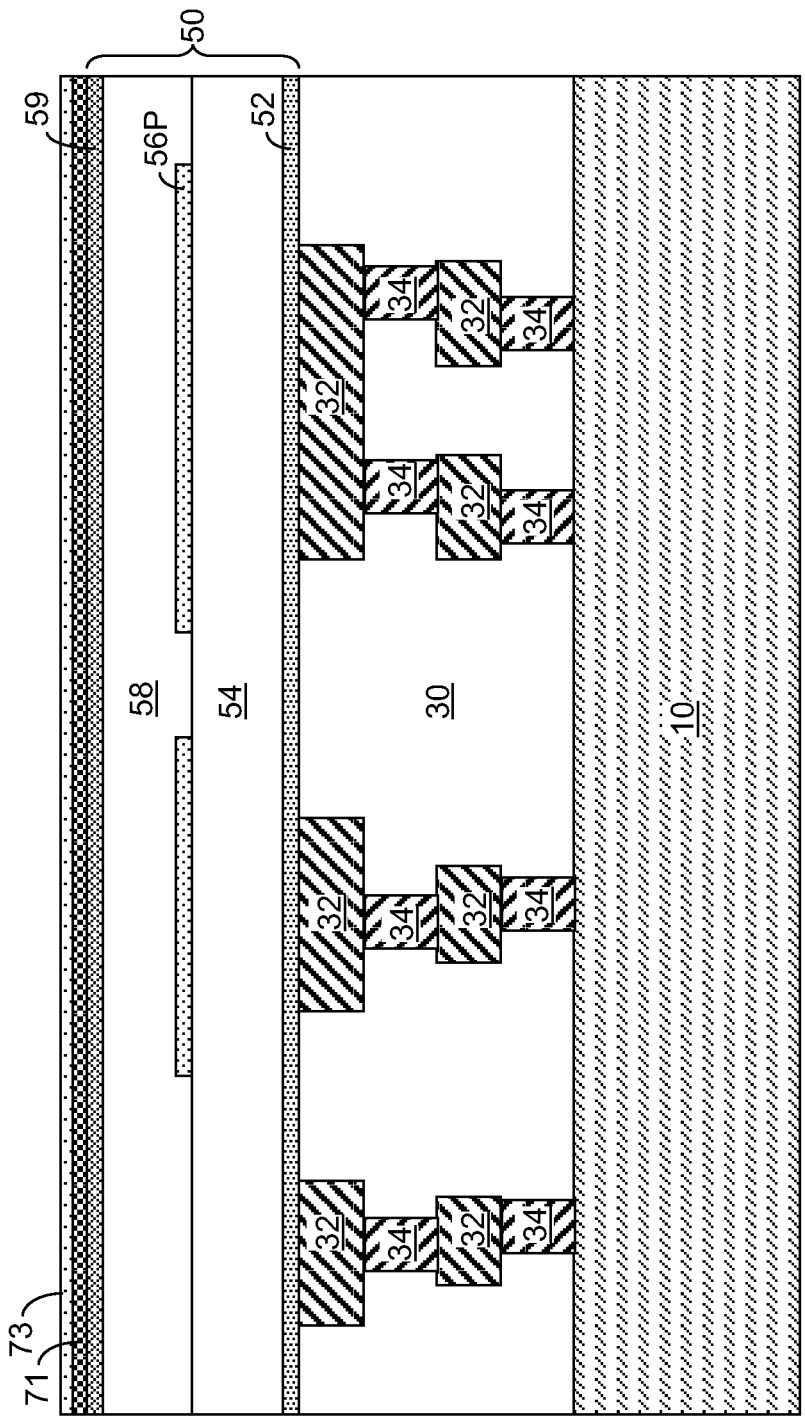
FIG. 3 is a vertical cross-sectional view of the exemplary structure after formation of a line level dielectric material layer, a dielectric cap layer, a metallic hard mask layer, and a dielectric hard mask layer according to an embodiment of the present disclosure.

Referring to FIG. 3, a line level dielectric material layer 58 is deposited on the etch stop dielectric material portions 56P and the via level dielectric material layer 54. The line level dielectric material layer 58 includes a dielectric material, which can be a porous or non-porous organosilicate glass having a dielectric constant less than 2.8. Alternately or additionally, the line level dielectric material layer 58 can include doped silicon oxide and/or undoped silicon oxide. In one embodiment, the line level dielectric material layer 58 can have the same composition as the via level dielectric material layer 54. In one embodiment, the line level dielectric material layer 58 and the via level dielectric material layer can consist of a porous or non-porous organosilicate glass. The line level dielectric material layer 58 can be formed, for example, by chemical vapor deposition. The thickness of the line level dielectric material layer 58 (as measured above the top surfaces of the etch stop dielectric material portions 56P) depends on the target height of via structures to be subsequently formed, and can be in a range from 10 nm to 300 nm, although lesser and greater thicknesses can also be employed.

A dielectric cap layer 59 can be optionally deposited on the top surface of the line level dielectric material layer 58. The dielectric cap layer 59, if present, includes a dielectric material having a greater resistance to chemical mechanical planarization than the dielectric material of the line level dielectric material layer 58. Further, the dielectric cap layer 59, if present, can also be used as an etch stop layer to protect the underlying dielectric material of the line level dielectric material layer 58 from plasma damage during subsequent etching processes. For example, the dielectric cap layer 59 can include silicon nitride, silicon oxynitride, silicon oxide, a nitrogen-doped organosilicate glass such as BLok™ by Applied Materials, Inc., or a dielectric metal oxide material. In one embodiment, the line level dielectric material layer 58 can include a porous or non-porous organosilicate glass, and the dielectric cap layer 59 can include silicon nitride or silicon oxide. The dielectric cap layer 59 can be formed, for example, by chemical vapor deposition (CVD). The thickness of the dielectric cap layer 59 can be from 1 nm to 10 nm, although lesser and greater thicknesses can also be employed.

At least one hard mask layer can be formed on the top surface of the dielectric cap layer 59, or, if a dielectric cap layer is not present, on the top surface of the line level dielectric material layer 58. In one embodiment, the at least one hard mask layer can include, for example, a stack of a metallic hard mask layer 71 and a dielectric hard mask layer 73. In another embodiment, the at least one hard mask layer can consist of a metallic hard mask layer 71. In yet another embodiment, the at least one hard mask layer can consist of a dielectric hard mask layer 73. In still another embodiment, the at least one hard mask layer can include three or more layers that contain at least one metallic hard mask layer and at least one dielectric hard mask layer. While the present disclosure is described for an embodiment in which the at least one hard mask layer includes a stack, from bottom to top, of a metallic hard mask layer 71 and a dielectric hard mask layer 73, embodiments in which the at least one hard mask layer includes different material stacks are expressly contemplated herein.

The metallic hard mask layer 71, if present, includes a metallic material such as TiN, TaN, WN, TiC, TaC, WC, Ti, Ta, W, or combinations thereof. The metallic hard mask layer 71 can be formed as a blanket metallic hard mask layer, i.e., a metallic hard mask layer without any pattern therein and having a uniform thickness throughout the entirety thereof. The metallic hard mask layer 71 can be deposited, for example, by physical vapor deposition (PVD) or chemical vapor deposition. The thickness of the metallic hard mask layer 71 can be from 10 nm to 50 nm, although lesser and greater thicknesses can also be employed.

The dielectric hard mask layer 73, if present, includes a dielectric material that can be employed as a stopping layer for removal of a photoresist material applied thereabove. If a lithographic rework process needs to be performed, the dielectric hard mask layer 73 can protect the underlying material layers during the lithographic rework process. The dielectric hard mask layer 73 includes a dielectric material such as silicon oxide, silicon oxynitride, silicon nitride, and nitrogen-doped organosilicate glass, or a combination thereof. In one embodiment, the dielectric hard mask layer 73 can include silicon oxide deposited by chemical vapor deposition or plasma chemical vapor deposition process that employs tetraethylorthosilicate (TEOS) and oxygen as precursors. The thickness of the dielectric hard mask layer 73 can be from 5 nm to 20 nm, although lesser and greater thicknesses can also be employed.

The optional dielectric liner 52, the via level dielectric material layer 54, the patterned etch stop dielectric material portions 56P, the line level dielectric material layer 58, and the dielectric cap layer 59 collectively constitute a dielectric material stack 50'. The etch stop dielectric material portions 56P can be present in one region and not present in another region. For example, the etch stop dielectric material portions 56P can be present in the first region R1 and the third region R3, and not present in the second region R2. (See FIG. 2A.)

Each of the dielectric cap layer 59, the metallic hard mask layer 71, and the dielectric hard mask layer 73 can be formed as a blanket material layer, i.e., as an unpatterned material layer, having a uniform thickness throughout. No conductive structure is present within the dielectric material stack 50 upon formation of the dielectric material stack 50.

Figure 4:
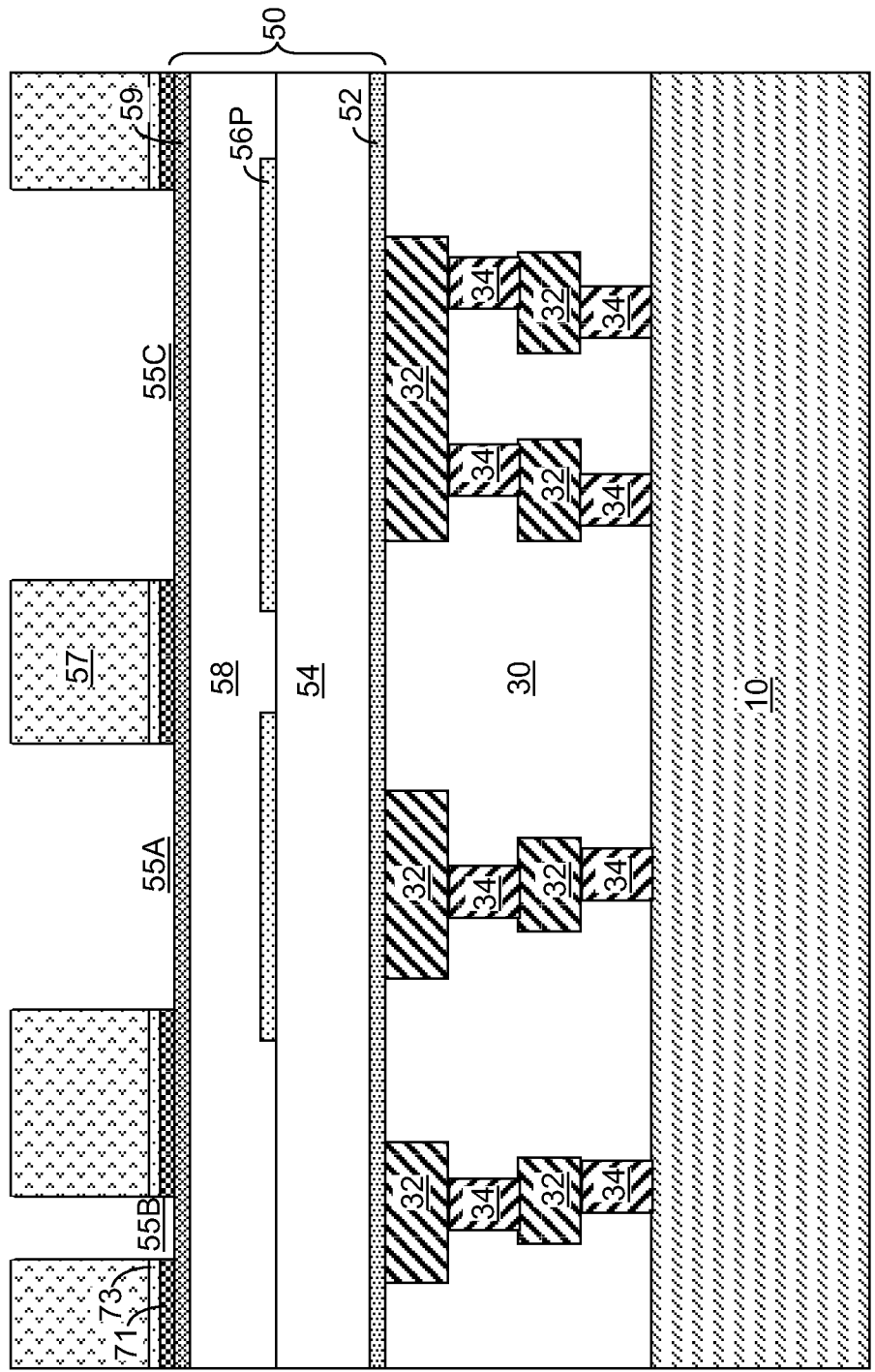
FIG. 4 is a vertical cross-sectional view of the exemplary structure after patterning the dielectric hard mask layer and the metallic hard mask layer with a first pattern employing a first photoresist layer according to an embodiment of the present disclosure.

Referring to FIG. 4, a first photoresist layer 57 is applied over the at least one hard mask layer (71, 73), and is lithographically patterned with a first pattern. The first pattern is defined by the shapes of openings in the patterned first photoresist layer 57. The first pattern includes shapes of metal lines to be subsequently formed within the line level dielectric material layer 58. The shapes of the openings that are formed in the patterned first photoresist layer 57 constitute the first pattern. In an illustrative example, the first pattern can include a first line shape located within the first region R1, a second line shape located within the second region R2, and a third shape located within the third region R3. (See FIG. 2A.)

The first pattern is transferred through the at least one hard mask layer (71, 73) by an etch that employs the patterned first photoresist layer 57 as an etch mask. The etch can be a dry etch or a wet etch. In one embodiment, the etch can be an anisotropic etch that replicates the first pattern within the patterned at least one hard mask layer (71, 73). Alternately, the etch can be an isotropic etch, and the sidewalls of the patterned at least one hard mask layer (71, 73) can be laterally offset outward from the shapes within the first pattern in the patterned photoresist layer 57 by a same lateral offset dimension. In one embodiment, the lateral offset dimension can be less than the thickness of the at least one hard mask layer (71, 73), and can be less than 10 nm. The patterned first photoresist layer 57 is removed selective to the at least one hard mask layer (71, 73) and the dielectric cap layer 59 (or selective to the line level dielectric material layer 58 if a dielectric cap layer is not present). The dielectric cap layer 59, if present, can function as an etch stop layer to protect the underlying dielectric material of the line level dielectric material layer 58 from plasma damage during the anisotropic etch.

Figure 5:
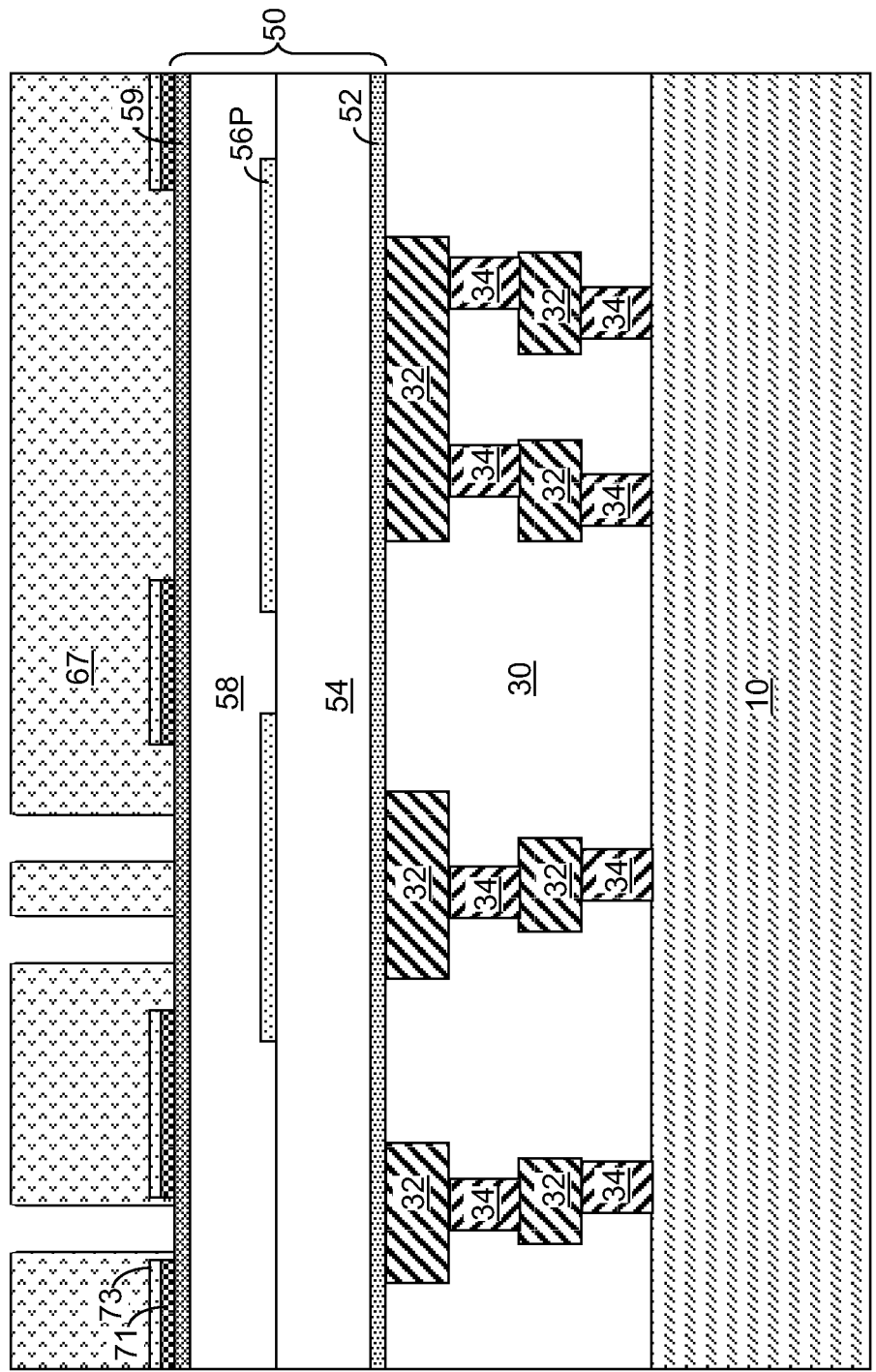
FIG. 5 is a vertical cross-sectional view of the exemplary structure after forming a patterned photoresist layer including a second pattern according to an embodiment of the present disclosure.

Referring to FIG. 5, a second photoresist layer 67 is applied over the patterned at least one hard mask layer (71, 73), and is lithographically patterned with a second pattern. The second pattern is defined by the shapes of the openings in the patterned second photoresist layer 67. The second pattern is different from the first pattern. The second pattern includes shapes of metal via structures to be subsequently formed within the via level dielectric material layer 54. The shapes of the openings that are formed in the patterned second photoresist layer 67 constitute the first pattern. The opening may or may not overlie the etch stop dielectric material portions 56P. In an illustrative example, the second pattern can include first via shapes located within the first region R1 and second via shapes located within the second region R2. (See FIG. 2A.) In one embodiment, the openings in the patterned second photoresist layer 67 may not overlie a region such as the third region R3. (See FIG. 2A.)

Each shape of the second pattern can at least partially overlap with a shape of the first pattern. In one embodiment, the shapes of the second pattern can be entirely within the shapes of the first pattern. In another embodiment, the shapes of the second pattern can be designed to be entirely within the shapes of the first pattern. In yet another embodiment, the shapes of the second pattern can be designed to be entirely within the shapes of the first pattern within a certain overlay tolerance, and to be partially outside the shapes of the first pattern if the overlay deviation of the second pattern is greater than a predetermined threshold.

Figure 6:
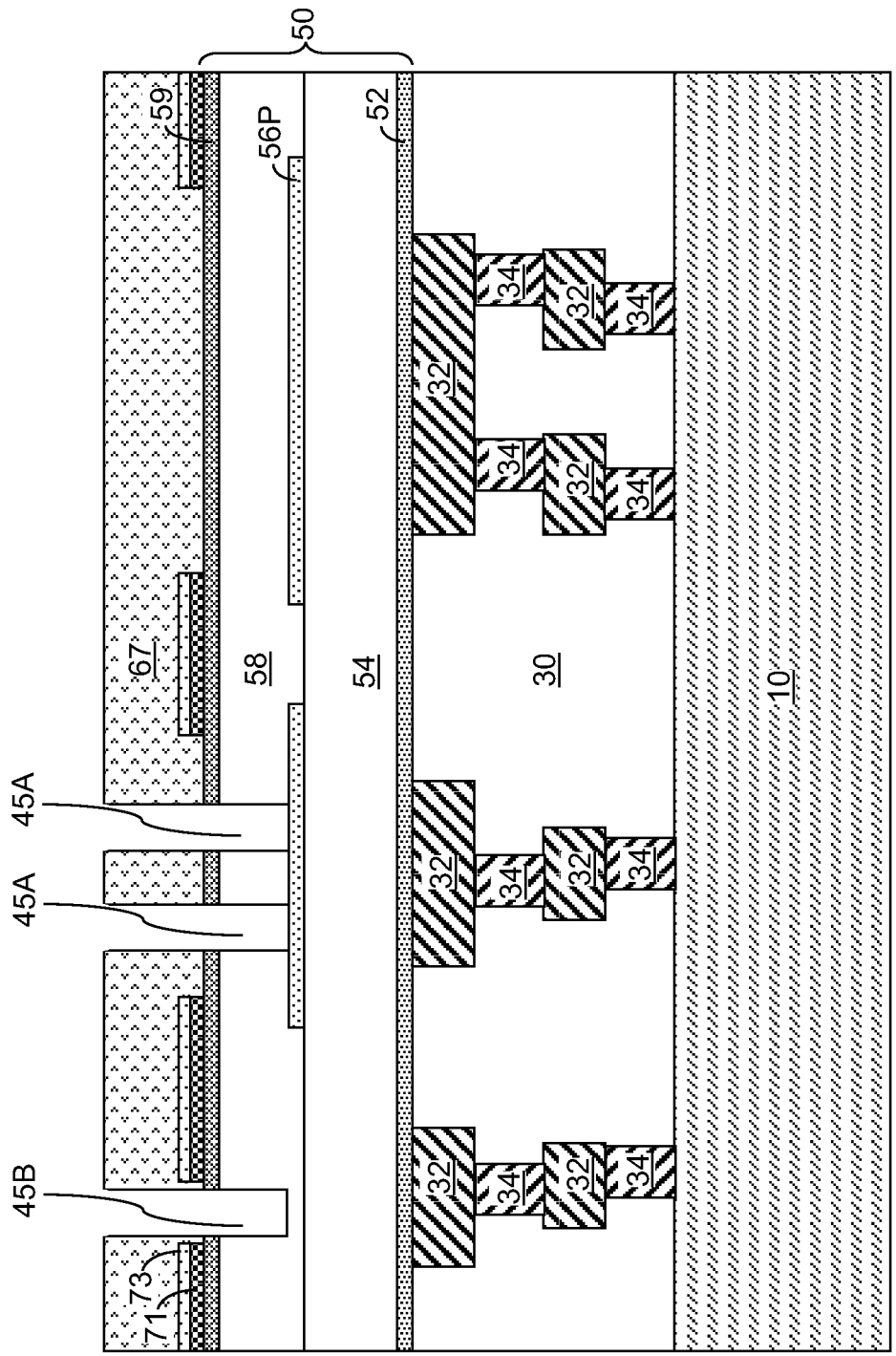
FIG. 6 is a vertical cross-sectional view of the exemplary structure after transfer of the second pattern through the line level dielectric material layer according to an embodiment of the present disclosure.

Referring to FIG. 6, the second pattern is transferred into the line level dielectric material layer 58 by an anisotropic etch that employs the patterned second photoresist layer 67 as an etch mask. Further, the patterned at least one hard mask layer (71, 73) functions as an additional mask that prevents transfer of any portion of the second pattern that is located outside the openings in the at least one hard mask layer (71, 73). Thus, the combination of the second photoresist layer 67 and the patterned at least one hard mask layer (71, 73) functions as an etch mask that transfers a composite pattern into the line level dielectric material layer 58. The composite pattern is an intersection of the first pattern and the second pattern.

The anisotropic etch replicates the composite pattern of the intersection of the first pattern and the second pattern in the line level dielectric material layer 58, and form various cavities. Thus, if the shapes of the second pattern are located entirely within the shapes of the first pattern, the second pattern can be transferred into the line level dielectric material layer 58. If a portion of a shape of the second pattern is located outside of the openings in the at least one hard mask layer (71, 73), the at least one hard mask layer (71, 73) can prevent transfer of the portion of the shape of the second pattern that is located outside the openings in the at least one hard mask layer (71, 73).

In regions in which the etch stop dielectric material portions 56P are present (such as the first region R1; See FIG. 2A), the etch stop dielectric material portions 56P can function as an etch stop structure. Thus, the etch stop dielectric material portions 56P can be employed for the purpose of endpointing the anisotropic etch that vertically extends the various via shape cavities (45A, 45B) down to the top surface of the etch stop dielectric material portions 56P.

The various cavities are herein referred to as via shape cavities, which can have the same horizontal cross-sectional shapes as the metal via structures to be subsequently formed within the via level dielectric material layer 54. The various cavities can include at least one first via shape cavity 45A and at least one second via cavity 45B. The at least one first via cavity 45A refers to at least one first cavity that is formed within the first region R1. The at least one second via shape cavity 45B refers to at least one second cavity that is formed within the second region R2. (See FIG. 2A.) In one embodiment, no via shape cavity may be formed in a region such as the third region R3 (See FIG. 2A.)

The at least one first via shape cavity 45A and at least one second via cavity 45B are simultaneously etched through the line level dielectric material layer 58 during the anisotropic etch. The etching of the at least one first via shape cavity 45A can stop on the etch stop dielectric material portions 56P, and the etching of the at least one second via shape cavity 45B can proceed without etching any region of the etch stop dielectric material portions 56P. In one embodiment, the shapes of the at least one first via shape cavity 45A and the at least one second via shape cavity 45B may have substantially the same lateral dimension (e.g., a diameter of circular via cavities), and the at least one second via shape cavity 45B may be formed with a greater depth than the at least one first via shape cavity 45A due to the termination of the at least one first via shape cavity 45A by a top surface of the etch stop dielectric material portions 56P. Some or all of the second photoresist layer 67 may be consumed during the anisotropic etch.

In one embodiment, each of the at least one first via shape cavity 45A and the at least one second via cavity 45B can have the same horizontal cross-sectional shape as a corresponding opening in the second pattern. In another embodiment, each of the at least one first via shape cavity 45A and the at least one second via cavity 45B can have the same horizontal cross-sectional shape as an intersection between a corresponding opening in the second pattern and a shape of an opening in the first pattern that intersects the corresponding opening in a see-through top-down view.

Figure 7:
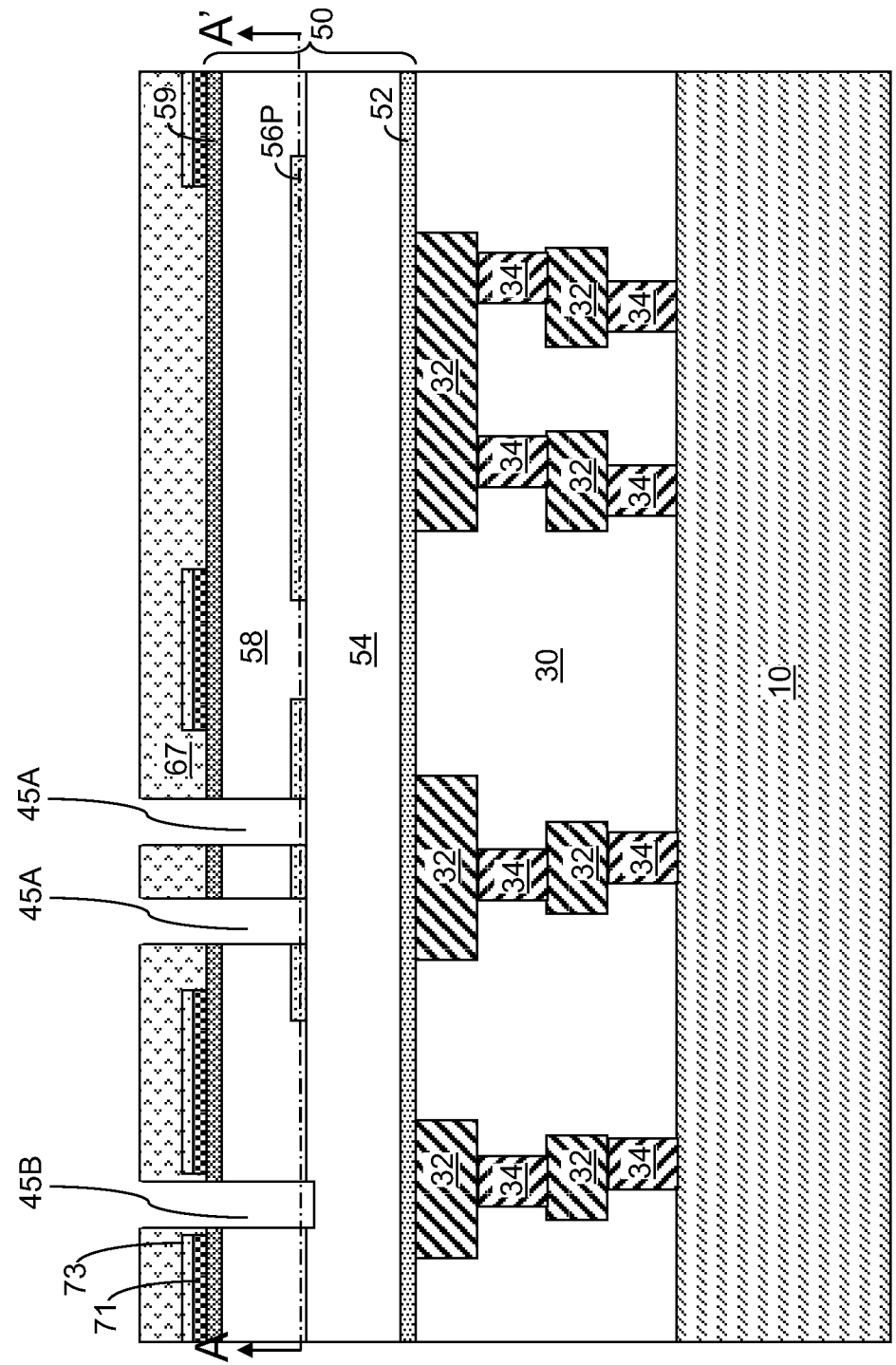
FIG. 7 is a vertical cross-sectional view of the exemplary structure after removing physically exposed regions of the patterned etch stop dielectric material portions according to an embodiment of the present disclosure.
Figure 7A:
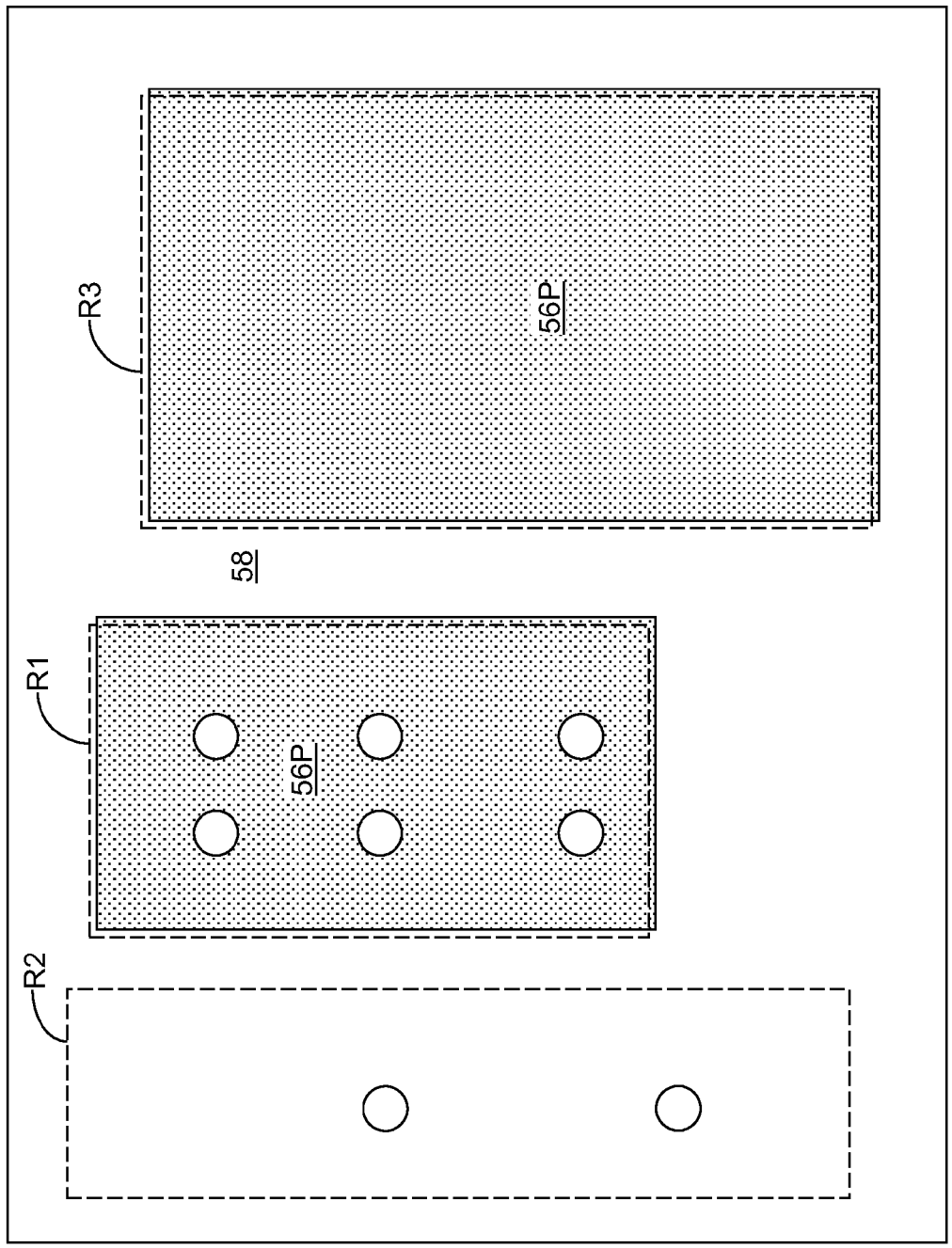
FIG. 7A is a horizontal cross-sectional view of the exemplary structure of FIG. 7 along the plane A-A'.

Referring to FIGS. 7 and 7A, the physically exposed regions of the etch stop dielectric material portions 56P are removed from underneath each of the at least one first via shape cavity 45A by an etch, which is herein referred to as an etch stop breakthrough etch. The etch may be an anisotropic etch, and may or may not be selective to the dielectric materials of the line level dielectric material layer 58 and the via level dielectric material layer 54. The etch stop breakthrough etch may also etch additional dielectric material of the line level dielectric material layer 58 and/or the via level dielectric material layer 54 from underneath the at least one second via shape cavity 45B. The at least one first via shape cavity 45A and the at least one second via shape cavity 45B are vertically extended by the etch stop breakthrough etch. In one embodiment, the at least one second via shape cavity 45B may have a greater depth than the at least one first via shape cavity 45A at the end of the etch stop breakthrough etch. Some or all of the remaining portions of the second photoresist layer 67 may be consumed during the etch stop breakthrough etch.

Figure 8:
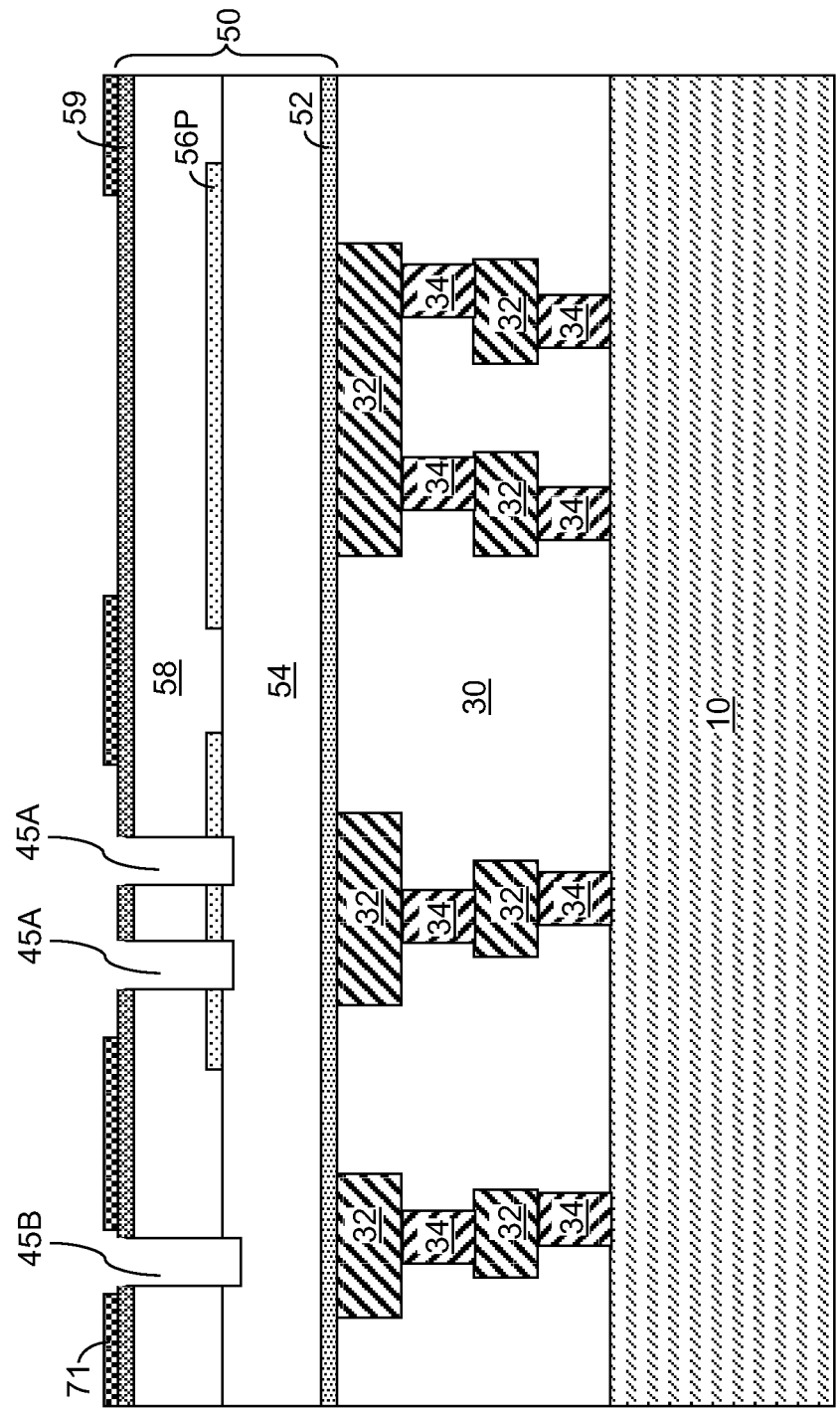
FIG. 8 is a vertical cross-sectional view of the exemplary structure after removal of the second photoresist layer according to an embodiment of the present disclosure.

Referring to FIG. 8, any remaining portion of the second photoresist layer 67 is removed selective to the dielectric cap layer 59, the line level dielectric material layer 58, the via level dielectric material layer 54, and at least one layer within the at least one hard mask layer (71, 73). In one embodiment, the dielectric hard mask layer 73 may be consumed during the etch stop breakthrough etch or may be removed during, or after, the removal of the second photoresist layer 67. In this case, the removal of the dielectric hard mask layer 73 can be selective to the metallic hard mask layer 71, i.e., does not remove the material of the metallic hard mask layer 71. In another embodiment, the dielectric hard mask layer 73 may not be removed at this step.

In one embodiment, the removal of the remaining portion of the second photoresist layer 67 and/or the removal of the dielectric hard mask layer 73 may provide a collateral etching of the via level dielectric material layer 54 so that the at least one first via shape cavity 45A and the at least one second via shape cavity 45B are extended vertically into an upper portion of the via level dielectric material layer 54. The dielectric cap layer 59, if present, can function as a protective layer to protect the underlying dielectric material of the line level dielectric material layer 58 during the removal of the second photoresist layer and/or during the removal of the dielectric hard mask layer 73.

Figure 9:
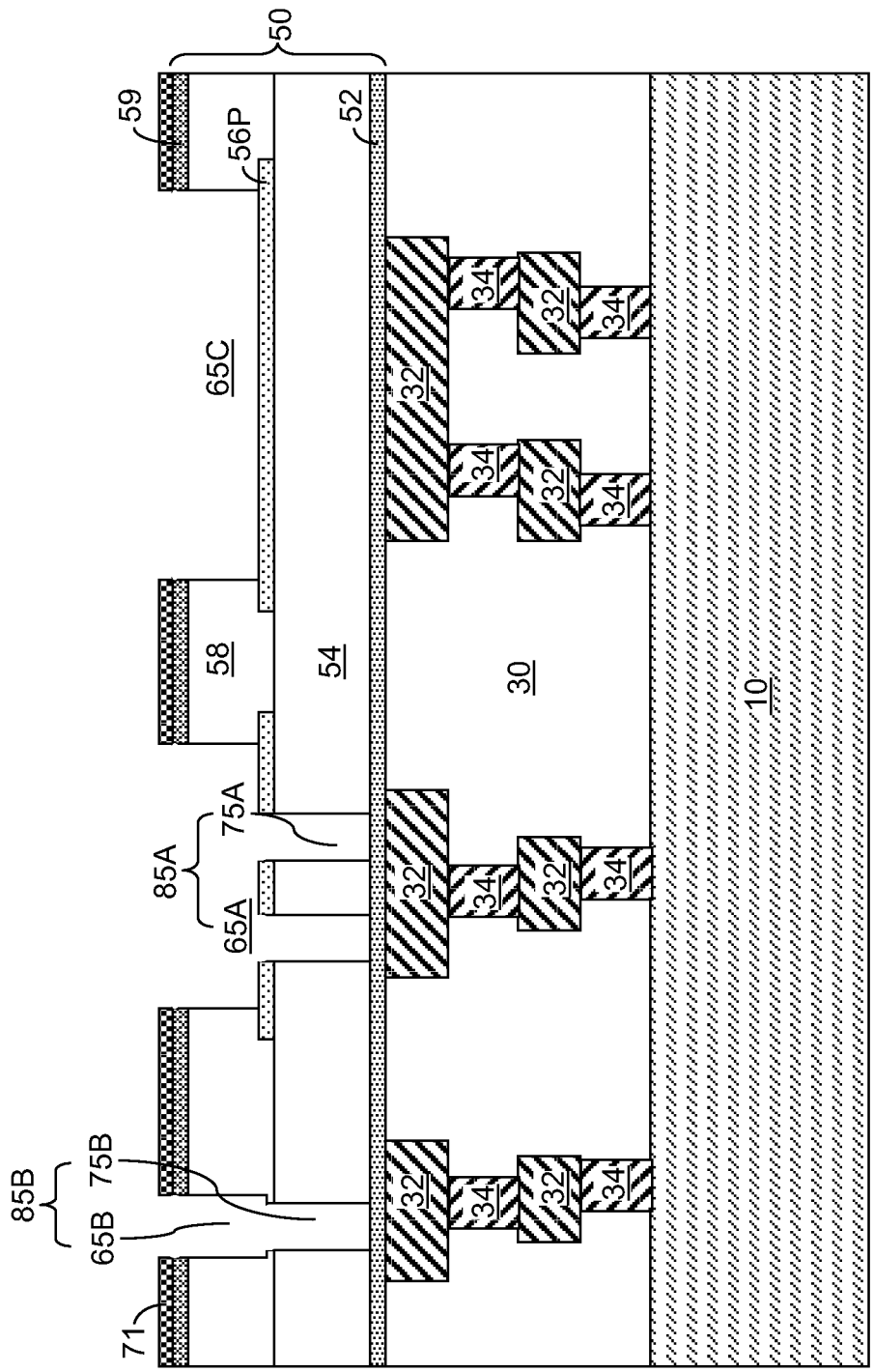
FIG. 9 is a vertical cross-sectional view of the exemplary structure after formation of integrated line and via cavities according to an embodiment of the present disclosure.

Referring to FIG. 9, integrated line and via cavities are formed by an anisotropic etch that simultaneously etches the dielectric material of the via level dielectric material layer 54 from underneath the various via shape cavities (45A, 45B) and the dielectric material of the line level dielectric material layer 58 from underneath openings in the metallic hard mask layer 71 (and the dielectric hard mask layer 73 if the dielectric hard mask layer 73 is still present—See FIG. 7). The first pattern is transferred into the line level dielectric material layer 58 by the anisotropic etch employing the at least one patterned hard mask layer (71, 73) as an etch mask layer, and line level trenches are formed in the line level dielectric material layer. The line level trenches can include, for example, a first line level trench 65A formed in the first region R1, a second line level trench 65B formed in the second region R2, and a third line level trench 65C formed in the third region R3 (See FIG. 7A).

The second pattern (or the composite pattern of the intersection of the second pattern and the first pattern if the second pattern includes areas that are not included in the first pattern) is transferred through the via level dielectric material layer 54 simultaneously with the transferring of the first pattern into the line level dielectric material layer 58. Via level trenches are formed in the via level dielectric material layer. The via level trenches can include, for example, at least one first via trench 75A that replicate the shape of the at least one first via shape trench 45A and at least one second via trench 75B that replaces the shape of the at least one second via shape trench 75B.

One or more of the line level trenches (65A, 65B) may be contiguously connected to at least one underlying via level trench (75A, 75B) to form an integrated line and via trench (85A, 85B). For example, the first line level trench 65A and at least one first via level trench 75A are contiguously connected among one another, and collectively constitute a first integrated line and via trench 85A located in the first region R1. (See FIG. 7A.) Likewise, the second line level trench 65B and at least one second via level trench 75B are contiguously connected among one another, and collectively constitute a second integrated line and via trench 85B located in the second region R1. (See FIG. 7A.) In one embodiment, a line level trench may be a stand-alone line level trench that is not connected to any underlying via cavity. For example, the third line level cavity 65C located in the third region R3 may be a stand-alone cavity that is not connected to any underlying via cavity.

The at least one patterned etch stop dielectric material portion 56P can function as an etch stop structure during formation of the various line trenches (65A, 65B, 65C). In one embodiment, a remaining portion of a patterned etch stop dielectric material portion 56P within some line cavities may prevent further transfer of a portion of the first pattern below a horizontal plane of a top surface of the remaining portion of the patterned etch stop dielectric material portion 56P. For example, a remaining portion of a patterned etch stop dielectric material portion 56P within the first line cavity 65A can function as an etch stop layer, and can prevent further transfer of the portion of the first pattern corresponding to the first line cavity 65A below the horizontal plane of the top surface of the patterned etch stop dielectric material portions 56P. Likewise, a remaining portion of a patterned etch stop dielectric material portion 56P within the third line cavity 65A can function as an etch stop layer, and can prevent further transfer of the portion of the first pattern corresponding to the third line cavity 65C below the horizontal plane of the top surface of the patterned etch stop dielectric material portions 56P.

The at least one patterned etch stop dielectric material portion 56P may not be present in some regions. In one embodiment, the regions in which the at least one patterned etch stop dielectric material portion 56P is not present can be regions in which metal lines having the minimum metal line width are to be formed. Correspondingly, the width of the line cavities in such regions can be commensurate with the minimum metal line width. For example, the at least one patterned etch stop dielectric material portion 56P is not present in the second region R2, and the depth of the second line trench 65B may be greater than the depth of the first and third line cavities (65A, 65C). (See FIG. 7A.) In this case, the portion of the first pattern in the second region R2 can be transferred below the horizontal plane of the top surface of the remaining portion of the at least one patterned etch stop dielectric material portion 56P that are present in the first region R1 and the third region R3.

Each of the line cavities (65A, 65B, 65C) can have the same horizontal cross-sectional shape as corresponding openings in the at least one hard mask layer (71, 73). The anisotropic etch at the processing step of FIG. 9 simultaneously etches a first cavity, i.e., the first line cavity 65A, and a second cavity, i.e., the second line cavity 65B, through the line level dielectric material layer 58. The first line cavity 65A is formed in the first region R1 and etching of the first line cavity stops on the at least one etch stop dielectric material portion 56P, and the second line cavity 65B is formed in the second region R2. (See FIG. 7A.)

Figure 10:
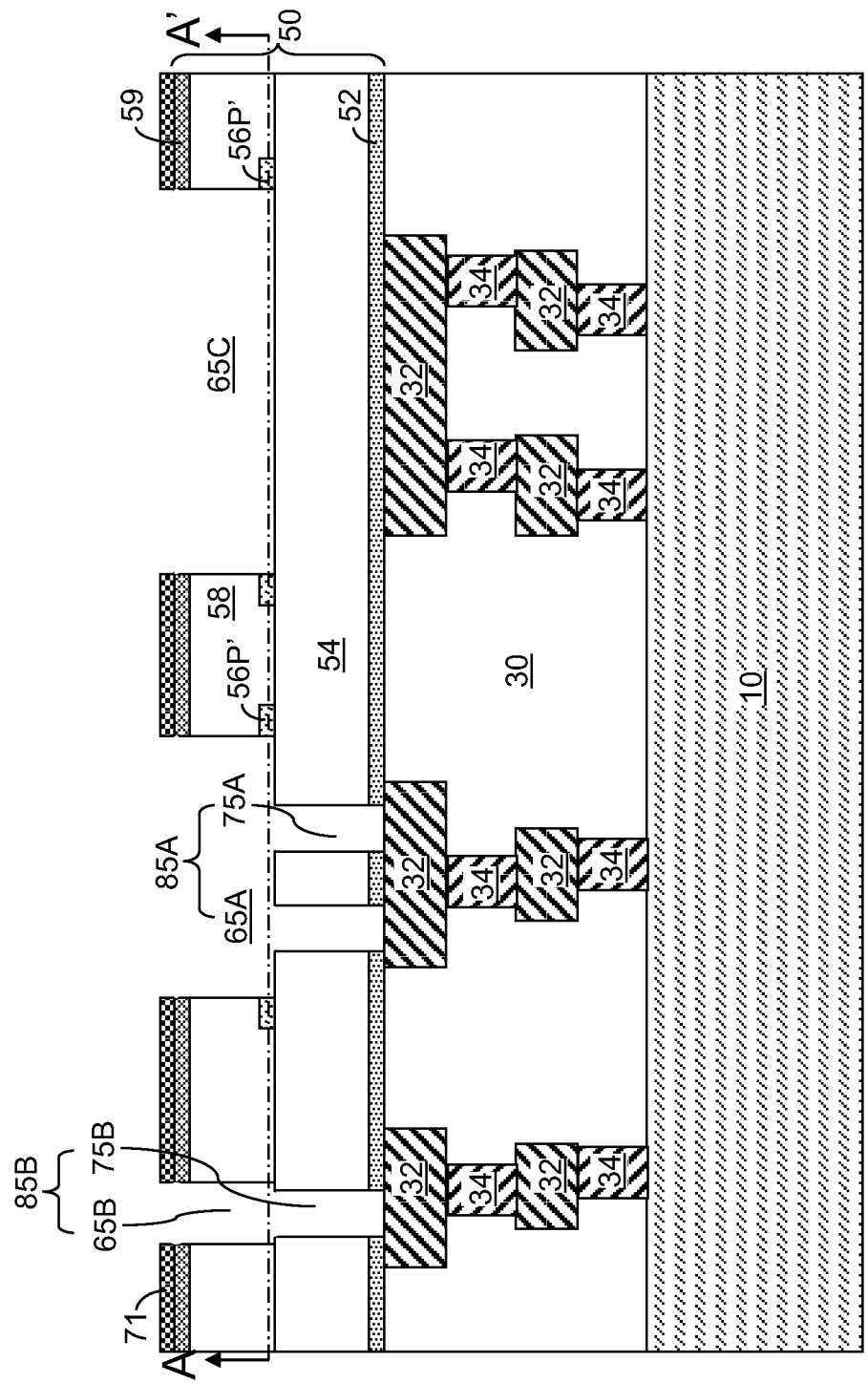
FIG. 10 is a vertical cross-sectional view of the exemplary structure after removing physically exposed regions of the dielectric liner and the patterned etch stop dielectric material portions according to an embodiment of the present disclosure.
Figure 10A:
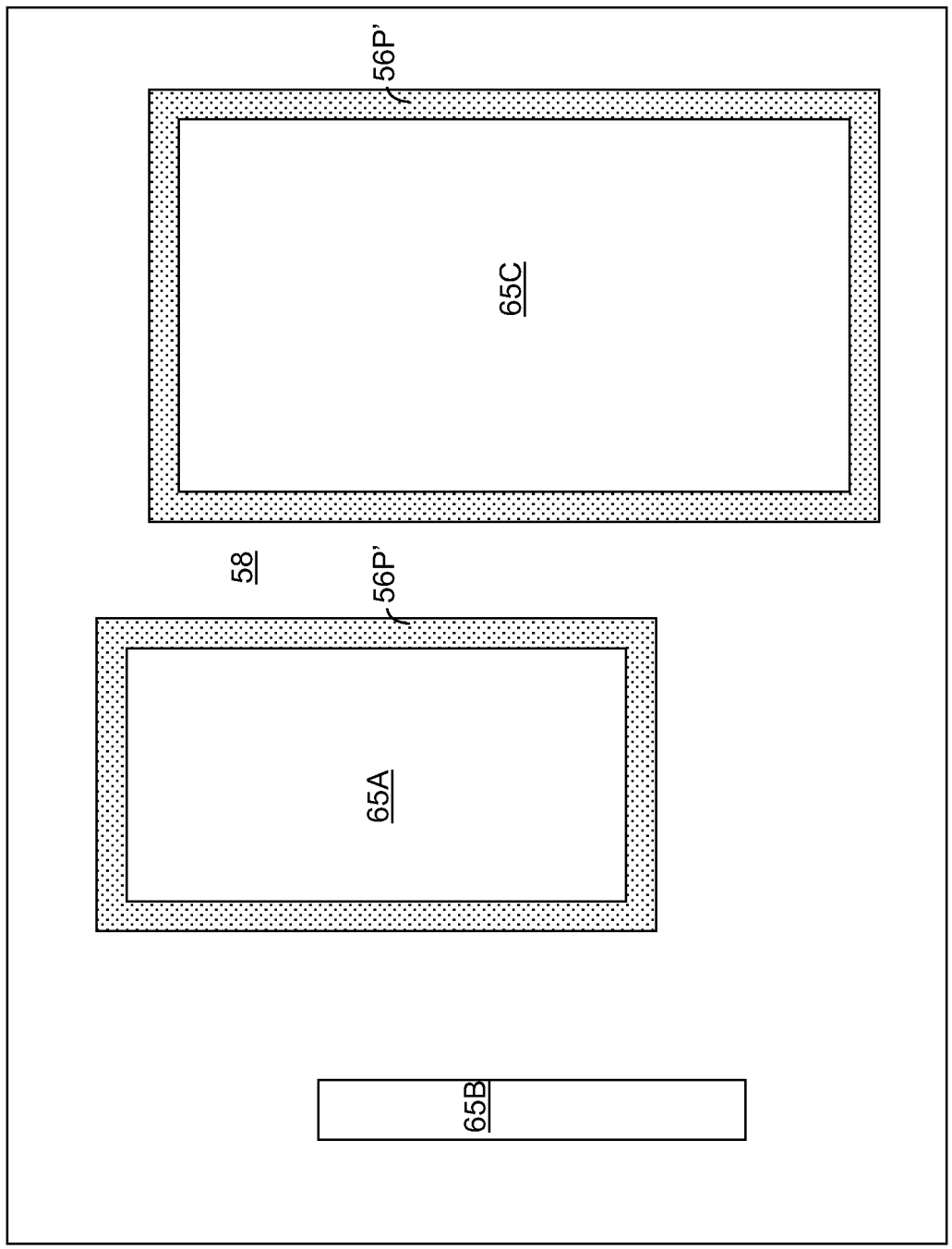
FIG. 10A is a horizontal cross-sectional view of the exemplary structure of FIG. 10 along the plane A-A'.

Referring to FIGS. 10 and 10A, physically exposed regions of the dielectric liner 52 and the at least one patterned etch stop dielectric material portion 56P are etched through by at least one breakthrough etch. The physically exposed regions of the dielectric liner 52 and the physically exposed regions of at least one patterned etch stop dielectric material portion 56P may be removed simultaneously by a single breakthrough etch process, or may be removed separately employing two breakthrough etch processes depending on the composition of the dielectric liner 52 and the at least one patterned etch stop dielectric material portion 56P. The physically exposed regions of the at least one patterned etch stop dielectric material portion 56P are removed from underneath the first line cavity 65A and from underneath the third line cavity 65C. Top surfaces of the metal interconnect structures (32, 34) are physically exposed at the bottom of the various via trenches including the at least one first via trench 75A and the at least one second via trench 75B.

In one embodiment, each remnant of the at least one patterned etch stop dielectric material portion 50P can constitute an etch stop dielectric material portion 56P', which can be homeomorphic to a torus and laterally surrounds a line cavity such as the first line cavity 65A or the third line cavity 65C. As used herein, an element is topologically homeomorphic to a three-dimensional shape if there exists a continuous transformation that maps the element to the three-dimensional shape without forming or destroying a singularity during the process of mapping.

Figure 11:
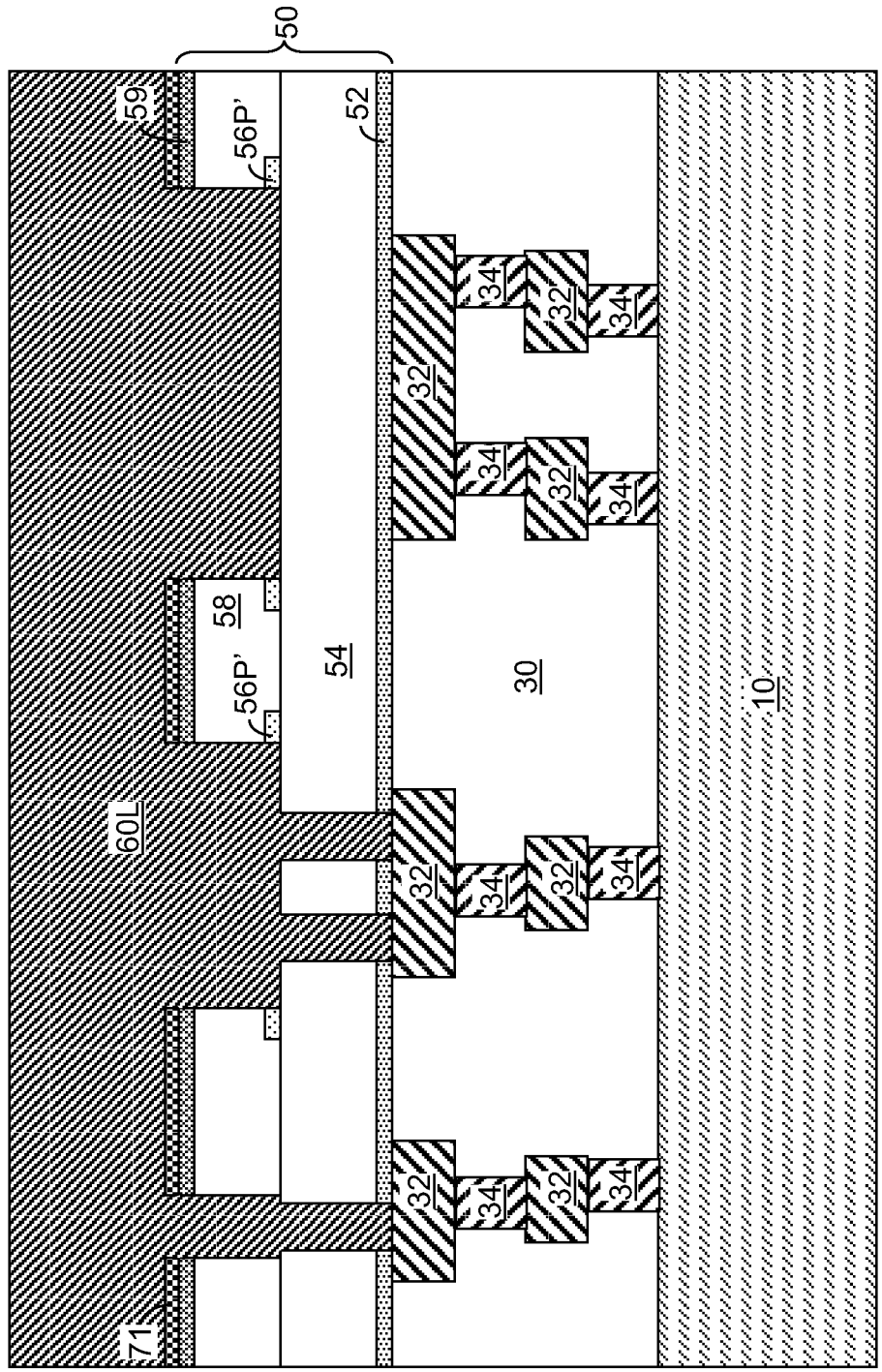
FIG. 11 is a vertical cross-sectional view of the exemplary structure after depositing at least one conductive material into the integrated line and via cavities according to an embodiment of the present disclosure.

Referring to FIG. 11, at least one conductive material is deposited into the various integrated line and via cavities (85A, 85B) and stand-alone line cavities such as the third line cavity 65C to form a conductive material layer 60L. The at least one conductive material can be any material for forming metal interconnect structures as known in the art. For example, the at least one conductive material can include copper, aluminum, tungsten, or combinations thereof. Further, at least one metallic liner material may be employed as one of the at least one conductive material. Materials that can be employed for the at least one metallic liner include, but are not limited to, TaN, TiN, WN, TaC, TiC, WC, Ta, Ti, W, and combinations thereof. Thus, the at least one conductive material is introduced into the cavities within the dielectric material stack 50. The cavities include the first integrated line and via cavity 85A that contains the first line cavity 65A and the at least one first via cavity 75A, the second integrated line and via cavity 85B that contains the second line cavity 65B and the at least one second via cavity 75B, and the third line cavity 65C. The first integrated line and via cavity 85A is a cavity that is expanded from the first line cavity 65A by addition of the at least one first via cavity 75A, and the second integrated line and via cavity 85B is a cavity that is expanded from the second line cavity 65B by addition of the at least one second via cavity 75B.

Figure 12:
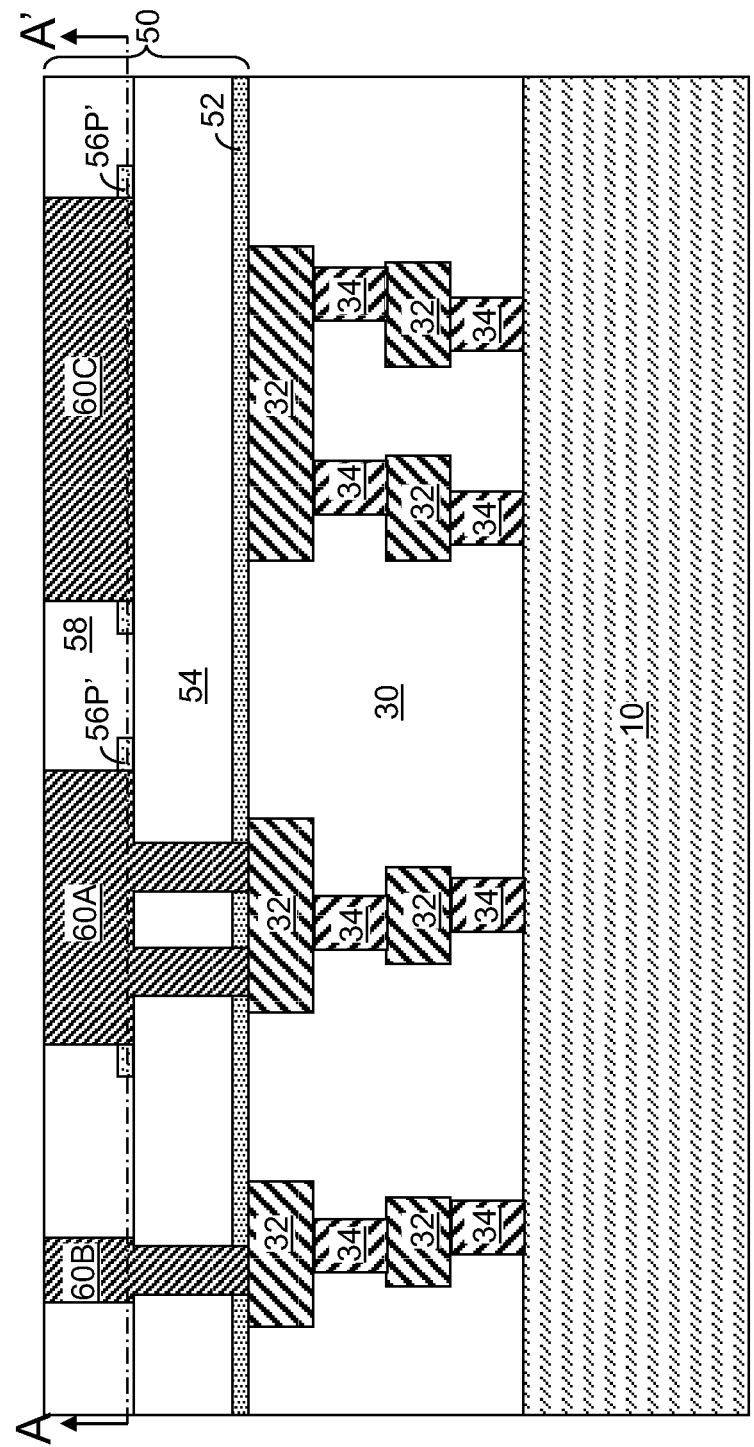
FIG. 12 is a vertical cross-sectional view of the exemplary structure after formation of integrated line and via structures by planarizing the at least one conductive material according to an embodiment of the present disclosure.
Figure 12A:
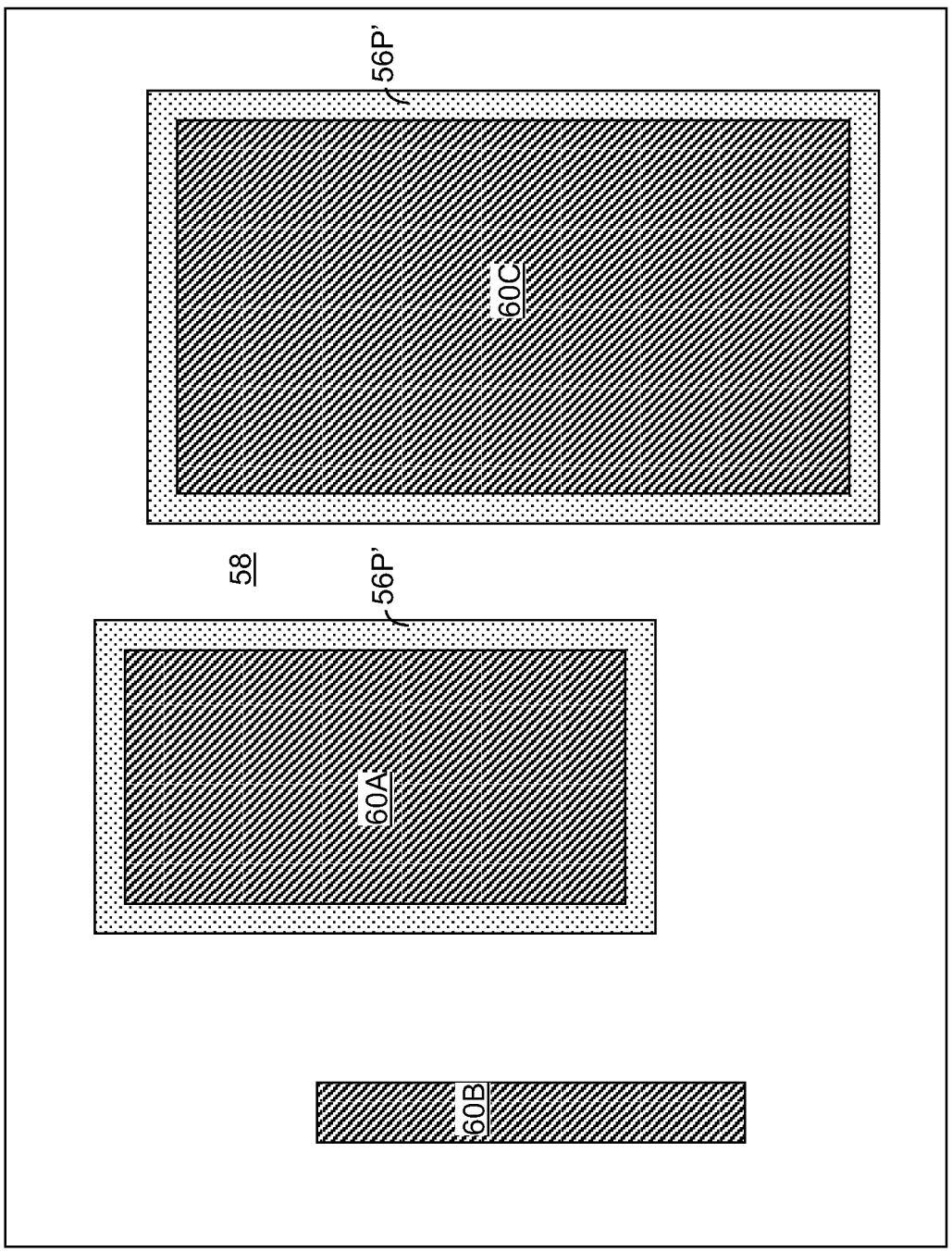
FIG. 12A is a horizontal cross-sectional view of the exemplary structure of FIG. 12 along the plane A-A'.

Referring to FIGS. 12 and 12A, the conductive material layer 60L is planarized, for example, by chemical mechanical planarization to form metal interconnect structures. The metallic hard mask layer 71 can be removed during the planarization process. The dielectric cap layer 59, if present, can be employed as a stopping layer for the planarization process. In one embodiment, the dielectric cap layer 59 may be removed at a final step of the planarization process. The remaining portions of the conductive material layer 60L after the planarization process include a first integrated line and via structure 60A that fills the first line and via cavity 85A, a second integrated line and via structure 60B that fills the second line and via cavity 85B, and a metallic line structure 60C that fills the third line cavity 65C. (See FIGS. 10 and 10A.)

The exemplary structure of FIGS. 12 and 12A includes a dielectric material stack 50 including at least a via level dielectric material layer 54, at least one etch stop dielectric material portion 56P', a line level dielectric material layer located 58 over a substrate 10. The exemplary structure further includes an integrated line and via structure 60A embedded within the dielectric material stack 50 and including at least one metallic via structure (i.e., the via structure portions of the integrated line and via structure 60A) and a metallic line structure (i.e., the metal line structure portion of the integrated line and via structure 60A). The at least one metallic via structure is embedded within the via level dielectric material layer 54, the metallic line structure is embedded within the line level dielectric material layer 58, and one of the at least one etch stop dielectric material portion 56P' laterally surrounds the metallic line structure.

A portion of a top surface of the via level dielectric material layer 54 is in physical contact with all bottommost surfaces of the line level dielectric material layer 58. All bottommost surfaces of the at least one etch stop dielectric material portion 56' can be coplanar with the top surface of the via level dielectric material layer 54.

In one embodiment, one or more of the at least one etch stop dielectric material portion 56P' can be topologically homeomorphic to a torus. All inner sidewalls of each etch stop dielectric material portion 56P' can be in physical contact with outer sidewalls of a metallic line structure such as the metal line structure portion of the integrated line and via structure 60A or the metallic line structure 60C. A bottom surface of each metallic line structure can be coplanar with a top surface of the via level dielectric material layer 54.

The exemplary structure can further include a second integrated line and via structure 60B embedded in the dielectric material stack 50 and not in physical contact with any material of the at least one etch stop dielectric material portion 56P' between a horizontal plane including a topmost surface of the dielectric material stack 50 and another horizontal plane including a bottommost surface of the dielectric material stack 50.

In one embodiment, a bottom surface of at least one etch stop dielectric material portion 56P' can be coplanar with a bottom surface of a metallic line structure such as the metal line structure portion of the integrated line and via structure 60A or the metallic line structure 60C. The dielectric material stack 50 may further include a dielectric liner 52 underlying the via level dielectric material layer 54. Top surfaces of the integrated line and via structures (60A, 60B) can be coplanar with a top surface of the dielectric material stack 50.

Figure 13:
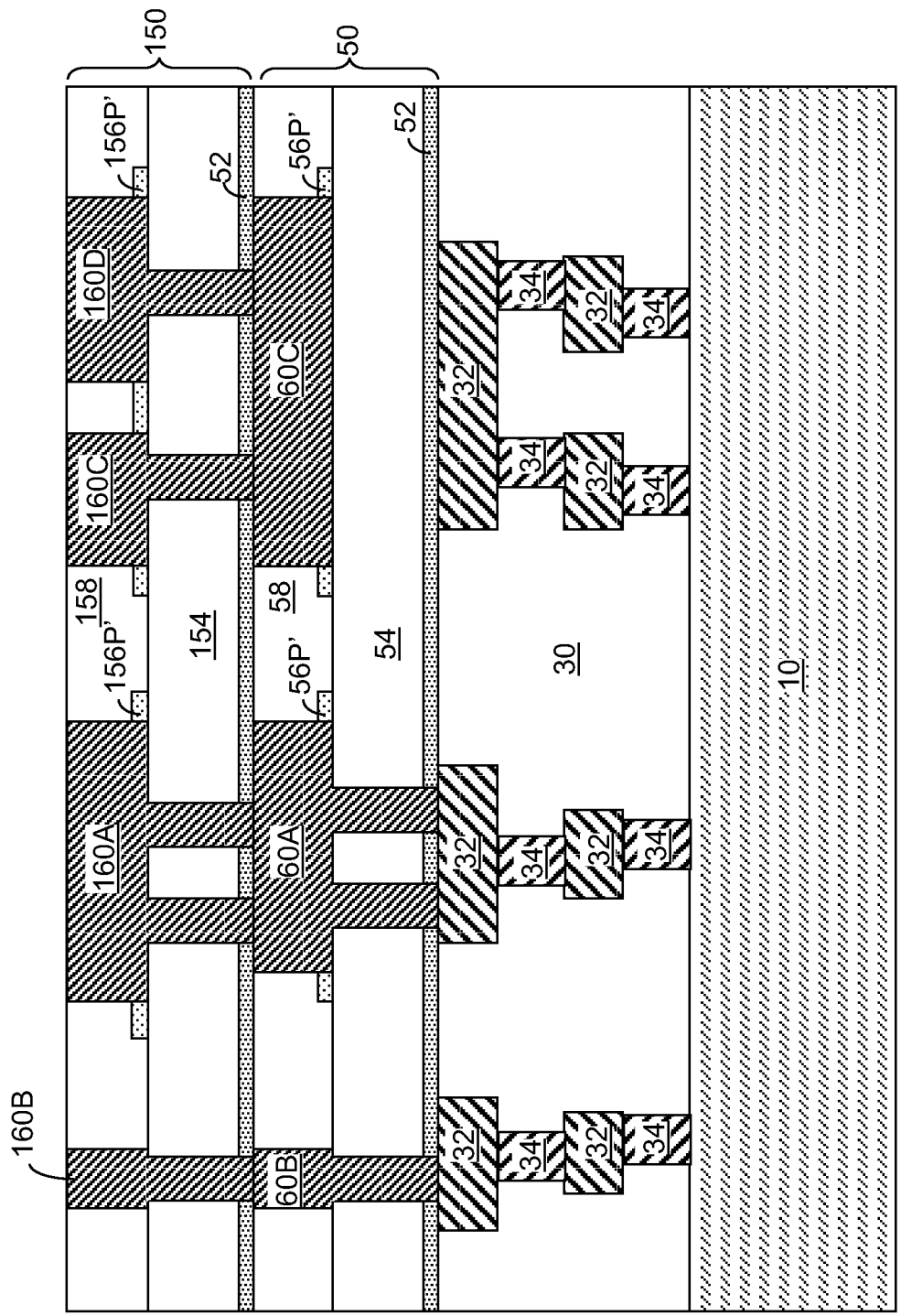
FIG. 13 is a vertical cross-sectional view of a variation of the exemplary structure according to an embodiment of the present disclosure.

Referring to FIG. 13, a variation of the exemplary structure according to an embodiment of the present disclosure is illustrated. An overlying dielectric material stack 150 including overlying metal interconnect structures (160A, 160B, 160C, 160D) can be formed above the dielectric material stack 50 employing the same processing steps that are employed to form the dielectric material stack 50 and the metal interconnect structures (60A, 60B, 60C). The overlying dielectric material stack 150 can include, for example, an overlying dielectric liner 152, an overlying via level dielectric material layer 154, overlying etch stop dielectric material portions 156P', and an overlying line level dielectric material layer 158. The overlying metal interconnect structures (160A, 160B, 160C, 160D) can include a first overlying line and via structure 160A, a second overlying line and via structure 160B, a first overlying metallic line structure 160C, and a second overlying metallic line structure 160D. Additional dielectric material stacks and metal interconnect structures embedded therein may further be formed above the overlying dielectric material stack 150 employing the methods of the present disclosure.

While the disclosure has been described in terms of specific embodiments, it is evident in view of the foregoing description that numerous alternatives, modifications and variations will be apparent to those skilled in the art. Each of the various embodiments of the present disclosure can be implemented alone, or in combination with any other embodiments of the present disclosure unless expressly disclosed otherwise or otherwise impossible as would be known to one of ordinary skill in the art. Accordingly, the disclosure is intended to encompass all such alternatives, modifications and variations which fall within the scope and spirit of the disclosure and the following claims.

What is claimed is:

1. A structure comprising:
    a dielectric material stack including, from bottom to top, at least a via level dielectric material layer, at least one etch stop dielectric material portion, and a line level dielectric material layer located over a substrate, wherein said at least one etch stop dielectric material portion has a bottom surface located directly on a top surface of said via level dielectric and wherein a top surface and a vertical sidewall edge of said at least one etch stop dielectric material portion is in contact with a portion of said line level dielectric material layer; and
    an integrated line and via structure embedded within said dielectric material stack and comprising at least one metallic via structure and a metallic line structure, wherein said at least one metallic via structure is embedded within said via level dielectric material layer, said metallic line structure is embedded within said line level dielectric material layer, and said at least one etch stop dielectric material portion laterally surrounds said metallic line structure, wherein a bottommost surface of the line level dielectric material layer is coplanar with the bottom surface of the at least one etch stop dielectric material portion, and wherein a top surface of the line level dielectric material layer is coplanar with a top surface of the metallic line structure, and wherein the bottommost surface of the line level dielectric material layer is coplanar with a bottom surface of the metallic line structure.

2. The structure of claim 1, wherein a portion of said top surface of said via level dielectric material layer is in physical contact with the entire bottommost surface of said line level dielectric material layer.

3. The structure of claim 2, wherein said bottom surface of said at least one etch stop dielectric material portion is coplanar with said top surface of said via level dielectric material layer.

4. The structure of claim 1, wherein all inner sidewalls of said one of said at least one etch stop dielectric material portion are in physical contact with outer sidewalls of said metallic line structure.

5. The structure of claim 1, wherein a bottom surface of said metallic line structure is coplanar with said top surface of said via level dielectric material layer.

6. The structure of claim 1, further comprising another integrated line and via structure embedded in said dielectric material stack and not in physical contact with any material of said at least one etch stop dielectric material portion between a horizontal plane including a topmost surface of said dielectric material stack and another horizontal plane including a bottommost surface of said dielectric material stack.

7. The structure of claim 6, wherein said metallic line structure of said integrated line and via structure has a same height as another metallic line structure of said another integrated line and via structure.

8. The structure of claim 1, wherein said bottom surface of at least one etch stop dielectric material portion is coplanar with a bottom surface of said metallic line structure.

9. A structure comprising:
    a dielectric material stack including, from bottom to top, at least a via level dielectric material layer, at least one etch stop dielectric material portion, and a line level dielectric material layer located over a substrate, wherein said at least one etch stop dielectric material portion has a bottom surface located directly on a top surface of said via level dielectric and wherein a top surface and a vertical sidewall edge of said at least one etch stop dielectric material portion is in contact with a portion of said line level dielectric material layer; and
    an integrated line and via structure embedded within said dielectric material stack and comprising at least one metallic via structure and a metallic line structure, wherein said at least one metallic via structure is embedded within said via level dielectric material layer, said metallic line structure is embedded within said line level dielectric material layer, and said at least one etch stop dielectric material portion laterally surrounds said metallic line structure, and wherein a bottommost surface of the line level dielectric material layer is coplanar with the bottom surface of the at least one etch stop dielectric material portion, and wherein said dielectric material stack further comprises a dielectric liner underlying said via level dielectric material layer, and a top surface of said integrated line and via structure is coplanar with a top surface of said dielectric material stack.

* * * * *